(12) United States Patent
Lucas et al.

(10) Patent No.: US 9,159,864 B2
(45) Date of Patent: Oct. 13, 2015

(54) BACK CONTACT PASTE WITH TE ENRICHMENT AND COPPER DOPING CONTROL IN THIN FILM PHOTOVOLTAIC DEVICES

(71) Applicant: First Solar, Inc., Tempe, AZ (US)

(72) Inventors: Tammy Jane Lucas, Highlands Ranch, CO (US); Scott Daniel Feldman-Peabody, Golden, CO (US); Laura Anne Clark, Brighton, CO (US); Michael Christoper Cole, Longmont, CO (US); Caroline Rae Corwine, Westminster, CO (US)

(73) Assignee: First Solar, Inc., Tempe, AZ (US)

( * ) Notice: Subject to any disclaimer, the term of this patent is extended or adjusted under 35 U.S.C. 154(b) by 35 days.

(21) Appl. No.: 13/950,605

(22) Filed: Jul. 25, 2013

(65) Prior Publication Data
US 2015/0031163 A1   Jan. 29, 2015

(51) Int. Cl.
| H01L 21/00 | (2006.01) |
| H01L 31/18 | (2006.01) |
| H01L 31/0224 | (2006.01) |

(52) U.S. Cl.
CPC .... H01L 31/1828 (2013.01); H01L 31/022441 (2013.01)

(58) Field of Classification Search
CPC ..... H01L 31/18; H01L 21/187; H01L 21/228; H01L 21/283; H01L 21/67011; H01L 21/7685; H01L 21/7688; H01L 31/048; H01L 31/055; H01L 33/62; H01L 45/06; H01L 45/144; H01L 45/1616; H01L 51/003
USPC ........ 438/84, 95, 98, 102; 257/467, 483, 485, 257/E21.07, E21.485
See application file for complete search history.

(56) References Cited

U.S. PATENT DOCUMENTS

| 4,735,662 A | 4/1988 | Szabo et al. |
| 5,557,146 A | 9/1996 | Britt et al. |
| 5,674,325 A | 10/1997 | Albright et al. |
| 2010/0184249 A1 | 7/2010 | Chen |
| 2010/0212731 A1 | 8/2010 | Abken |

(Continued)

FOREIGN PATENT DOCUMENTS

| CA | 2830054 A1 | 10/2012 |
| EP | 1433207 B1 | 8/2009 |

(Continued)

OTHER PUBLICATIONS

PCT International Search Report and Written Opinion, Application No. PCT/US14/48194, dated Oct. 15, 2014.

*Primary Examiner* — Mark A Laurenzi
(74) *Attorney, Agent, or Firm* — MacMillan, Sobanski & Todd, LLC

(57) ABSTRACT

Methods for forming a back contact on a thin film photovoltaic device are provided that include applying a conductive paste onto a surface defined by a p-type absorber layer (e.g., comprising cadmium telluride) of a p-n junction and curing the conductive paste to form a conductive coating on the surface defined by a p-type absorber layer of the p-n junction. The conductive paste can include a conductive material, a solvent system, and a binder such that during curing an acid from the conductive paste reacts to enrich the surface with tellurium while copper is deposited onto the Te enriched surface. The acid is then substantially consumed during curing.

15 Claims, 2 Drawing Sheets

(56) References Cited

U.S. PATENT DOCUMENTS

| | | |
|---|---|---|
| 2010/0261304 A1 | 10/2010 | Chang |
| 2011/0095240 A1 | 4/2011 | Nakamura et al. |
| 2011/0100415 A1 | 5/2011 | Osamura et al. |
| 2011/0143489 A1 | 6/2011 | Korevaar |
| 2011/0143490 A1 | 6/2011 | O'Keefe |
| 2011/0180137 A1 | 7/2011 | Iwamuro et al. |
| 2011/0209763 A1 | 9/2011 | Cho |
| 2011/0232746 A1 | 9/2011 | Carroll et al. |
| 2011/0259423 A1 | 10/2011 | Korevaar et al. |
| 2012/0028409 A1 | 2/2012 | Lucas et al. |
| 2014/0060633 A1 | 3/2014 | Lucas et la. |

FOREIGN PATENT DOCUMENTS

| | | |
|---|---|---|
| EP | 2323171 A1 | 5/2011 |
| EP | 2333844 A2 | 6/2011 |
| EP | 2337084 A2 | 6/2011 |
| EP | 2337088 A2 | 6/2011 |
| EP | 2337091 A2 | 6/2011 |
| WO | 9502899 A1 | 1/1995 |
| WO | 2007129097 A2 | 11/2007 |
| WO | 2010099047 A1 | 9/2010 |

US 9,159,864 B2

BACK CONTACT PASTE WITH TE ENRICHMENT AND COPPER DOPING CONTROL IN THIN FILM PHOTOVOLTAIC DEVICES

FIELD OF THE INVENTION

The subject matter disclosed herein relates generally to photovoltaic devices including a conductive paste as a back contact or part of a back contact of a thin film photovoltaic device.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to potentially convert more energy from the solar spectrum as compared to lower bandgap semiconductor materials historically used in solar cell applications (e.g., about 1.1 eV for silicon). The junction of the n-type layer and the p-type absorber layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type absorber layer (i.e., a positive, electron accepting layer) and the CdS layer acts as a n-type layer (i.e., a negative, electron donating layer).

A transparent conductive oxide ("TCO") layer is commonly used between the window glass and the junction forming layers. This TCO layer provides the front electrical contact on one side of the device and is used to collect and carry the electrical charge produced by the cell. Conversely, a back contact layer is provided on the opposite side of the junction forming layers and is used as the opposite contact of the cell. This back contact layer is adjacent to the p-type absorber layer, such as the cadmium telluride layer in a CdTe PV device.

Due to the high work function of CdTe, conventional metal back contacts are not generally viewed as being suitable. Instead, graphite pastes (either undoped or doped, for example with copper or mercury) are widely used as a back contact for CdTe PV cells. However, these graphite-paste back contacts tend to degrade significantly over time, as can be shown via accelerated lifetime testing. This degradation typically manifests itself as a decrease over time in fill factor (FF) and/or open circuit voltage ($V_{OC}$). The fill factor degradation is often driven by a decrease in shunt resistance ($R_{sh}$) and/or an increase in the series resistance ($R_{OC}$) over time. The degradation of the back contact electrodes undesirably leads to degradation of the solar cell efficiency, on a long-term basis.

A long held understanding of CdTe back contacts made from copper and completed with a conductive paste is that such back contacts need to have some tellurium enriching attribute/mechanism in order to form a good ohmic back contact, either as part of the copper step, as a separate etching process, or by directly depositing a Te-rich layer. Since using a separate etch or depositing a Te-rich layer require an additional process step prior to applying the back contact, it is desirable to use an approach wherein the back contact step creates the Te-rich layer during one of the existing processing steps. The same is true for the copper deposition step; it would be highly advantageous if this step could be combined with some other step in the process.

An early attempt to combine processing steps occurred when Tellurium enrichment was combined with the conductive graphite paste cure. The method involved the generation of acid by products as the paste cured and it was effective at achieving a good ohmic back contact initially, but the process was typically uncontrolled. Later it was discovered that the graphite paste continued to produce acid with time and this caused degradation to the photovoltaic cell. U.S. patent application Ser. No. 13/638,636 of Lucas, et al. filed on Aug. 31, 2012, which is incorporated herein by reference, discloses a method for controlling the Te enrichment during the application and curing of the back contact without loss in cell performance with time. This combination of processing steps reduces manufacture cost and time.

However, further reduction in the number of processing steps is still desired.

BRIEF DESCRIPTION OF THE INVENTION

Aspects and advantages of the invention will be set forth in part in the following description, or may be obvious from the description, or may be learned through practice of the invention.

Methods are generally provided for forming a back contact on a thin film photovoltaic device. In one exemplary method, a conductive paste is applied onto a surface defined by a p-type absorber layer (e.g., comprising cadmium telluride) of a p-n junction and cured to form a conductive coating on the surface defined by a p-type absorber layer of the p-n junction.

In one embodiment, the conductive paste comprises a conductive material, a solvent system, and a binder such that during curing an acid from the conductive paste reacts to enrich the surface with tellurium while copper is deposited onto the Te enriched surface. The acid is then substantially consumed during curing. For example, the conductive paste can include a copper source as a separate component within the conductive paste. Alternatively or additionally, the binder in the conductive paste can include a copper salt of a carboxylic acid, a sulfur based acid, a phosphorous based acid, or a combination thereof to serve as a source of copper. In certain embodiments, the conductive paste can further include a tellurium source (e.g., the conductive material can include tellurium).

In another embodiment, the conductive paste can include a conductive material, a copper source, and a binder such that during curing an acid from the conductive paste reacts to enrich the surface with tellurium while copper is reacted with the surface to form a copper tellurium compound (e.g., CuTe, $Cu_{1.4}Te$, $Cu_2Te$, or a combination thereof). The acid is then substantially consumed during curing.

In yet another embodiment, the conductive paste can include a conductive material, a solvent system, an interlayer metal source, and a binder such that during curing an acid from the conductive paste reacts to enrich the surface with tellurium while a metal dopant (e.g., copper, tellurium, titanium, gold, molybdenum, or combinations thereof) is deposited onto the Te enriched surface from the interlayer metal source. The acid is then substantially consumed during curing.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
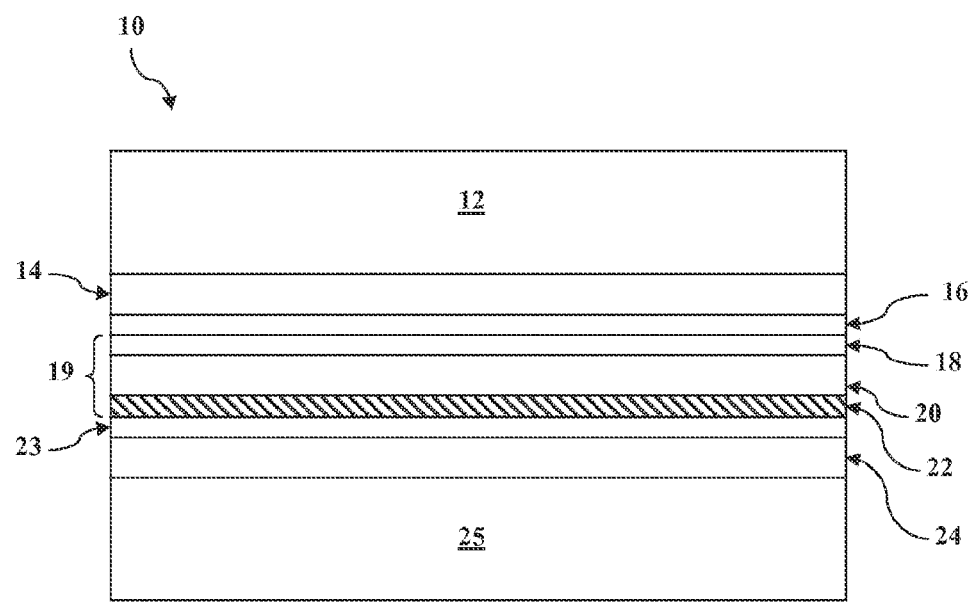
FIG. 1 shows a general schematic of a cross-sectional view of an exemplary cadmium telluride thin film photovoltaic device according to one embodiment of the present invention; and, FIG. 2 shows another cross-sectional view of the exemplary cadmium telluride thin film photovoltaic device shown in FIG. 1 prior to forming a tellurium enriched region; and, FIG. 3 shows a cross-sectional view of the exemplary cadmium telluride thin film photovoltaic device shown in FIG. 2 after applying the conductive paste onto the surface of the p-type absorber layer; and, FIG. 4 shows a cross-sectional view of the exemplary cadmium telluride thin film photovoltaic device shown in FIG. 3 after annealing the conductive paste on the surface of the p-type absorber layer during formation of the back contact.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Methods are generally disclosed for combining Cu doping and Te enrichment of an absorber layer (e.g., a CdTe layer) during the application and curing of the back contact onto the absorber layer with control of both Cu doping and Te enrichment levels.

A conductive paste is generally provided that can be permanently applied to a p-type absorber layer of CdTe to form a conductive layer that is part of the ohmic back contact. The conductive paste releases an acid upon processing with heat (e.g., during annealing) to subsequently provide tellurium enrichment upon contact with the CdTe surface. At the same time, components of the conductive paste also dope the surface of the CdTe with copper. As such, a Te-enriched layer and a copper telluride layer where the copper telluride layer is CuTe, $Cu_{1.4}Te$, $Cu_2Te$, and/or a copper doped telluride surface can be simultaneously formed within the p-type absorber layer during annealing of the device and the conductive paste. Such a method can reduce processing steps in the formation of the device.

However, the acid and/or any reactants that release acid during this processing are substantially consumed and/or liberated from the paste and/or bound from migration within the paste during processing of the back contact. The compounds responsible for the Cu doping are also fully consumed or become effectively inert during the processing of the back contact. Therefore, the release of acid and copper does not continue over time, even with additional current and/or heat applied to the resulting PV device. As such, the resulting module can achieve the benefit of the presence of acid and copper during processing of the back contact and the p-type absorber layer, while avoiding the drawbacks of leaving such an acid and copper source permanently in the resulting PV device. The conductive paste is, therefore, an active paste when deposited onto the p-type absorber layer, but becomes an inert layer (e.g., an inert graphite layer) in the resulting PV device.

In one embodiment, a thin film photovoltaic device is generally provided having a conductive coating as the back contact or as part of the back contact. For example, the conductive coating can be utilized between the CdTe of the thin film PV device and a metal contact layer. For example, the thin film photovoltaic device can include a cadmium telluride layer as the p-type absorber layer in direct contact with the conductive coating. In one embodiment, the conductive coating can generally provide improved adhesion to and/or contact between a cadmium telluride thin film layer of a cadmium telluride based thin film PV device and the back electrical contact, and also enrich the surface of the cadmium telluride layer with Te and Cu. Although the present disclosure is generally directed to cadmium telluride based thin film photovoltaic devices, it is to be understood that the conductive coating can be utilized in any PV device as the back contact or as part of the back contact.

FIG. 1 shows a cross-section of an exemplary cadmium telluride based thin-film photovoltaic device 10. The device 10 is shown including a transparent substrate 12 (e.g., a glass substrate), a transparent conductive oxide (TCO) layer 14, a resistive transparent buffer layer 16, an n-type layer 18 (e.g., a cadmium sulfide layer), a p-type absorber layer 20 (e.g., a cadmium telluride layer), a conductive coating 23, a metal contact layer 24, and a second substrate 25 (e.g., a glass substrate). The n-type layer 18 and the p-type absorber layer 20 generally form a p-n junction 19 in the device 10.

As discussed above, the conductive coating 23 is applied as a conductive paste onto the surface 21 defined by the p-type absorber layer 20, and is subsequently cured to react an acid from the conductive paste (e.g., an acid already within the conductive paste or produced from an acid generator in the conductive paste upon curing) and a copper source with the surface 21 to enrich with it with tellurium (Te) and copper (Cu). As such, annealing of the conductive coating 23 forms a Te-enriched and Cu-doped region 22 within the p-type absorber layer 20. For example, the Te-enriched region 22 can have an atomic ratio of tellurium to cadmium of greater than about 2 (e.g., about greater than about 10). The copper doping in the Te-enriched layer can have copper concentrations in the range of $$1 \times 10^{18} \frac{\text{Cu atoms}}{\text{cm}^3} \text{ to } 1 \times 10^{21} \frac{\text{Cu atoms}}{\text{cm}^3}.$$

On the other hand, a p-type absorber layer 20 formed from CdTe (i.e., a cadmium telluride layer) can have copper concentrations in the range of $$1 \times 10^{16} \frac{\text{Cu atoms}}{\text{cm}^3} \text{ to } 1 \times 10^{18} \frac{\text{Cu atoms}}{\text{cm}^3}$$

and is typically thicker than 0.5 µm (e.g., about 2 µm to about 5 µm).

In certain embodiments, the tellurium-enriched region 22 formed has a thickness of about 10 nanometers (nm) to about 1000 nm (e.g., about 20 nm to about 200 nm).

The conductive coating 23 can generally provide improved adhesion to and/or contact between the surface 21 of the p-type absorber layer 20 and the metal contact layer 24. Additionally, by being substantially free from a chemically active material (e.g., an acid or acid generator, or a copper source) after annealing, the device 10 can exhibit increased initial performance and increased long-term stability, including decreased delamination between the p-type absorber layer 20 and the metal contact layer 24.

The conductive paste utilized to form the conductive coating 23 can generally include a conductive material, a solvent system, and a binder. In one particular embodiment, at least one of these materials (i.e., the conductive material, the solvent system, or the polymeric binder) includes the acid or an acid generator, and a copper source. Alternatively, the conductive paste can further include the acid or an acid generator or the copper source as a separate component of the conductive paste.

The conductive material can be any material with a work function or electron affinity that closely matches that of CdTe. Since the work function of CdTe is about 5.5 eV, the desired material should have a work function greater than 4 eV. Additionally, the conductivity of this material should be greater than $1 \times 10^2 \, \Omega^{-1} \, \text{m}^{-1}$. Some examples of materials that fall into the work function and conductivity parameters and that are known to perform well for CdTe include graphite carbon, Ni and its compounds, Mo and its compounds, Zn and its compounds, and Ti and its compounds, Tc and its compounds, Cr and its compounds. As such, in one particular embodiment, the conductive material can include at least one of graphite carbon or a metallic conductive material (e.g., Ni, Mo, Zn, Ti, Tc, Cr, or alloys, or organic derivatives thereof).

In one embodiment, the conductive material includes graphite. Graphite can be provided in particle and/or fiber form. For example, the particles can have an average size of about 50 µm or less. For example, graphite particles and/or fibers can be included in the conductive paste in a weight amount of about 25% by weight to about 65% by weight (e.g., about 35% by weight to about 55% by weight), and can be included in the conductive paste in a solids weight amount of about 65% by weight to about 90% by weight (e.g., about 70% by weight to about 85% by weight). In one embodiment, nanofiber graphite and/or carbon nanotubes (i.e., with dimensions on the nano-scale) can be utilized as the conductive material. In such embodiments utilizing nanofiber graphite and/or carbon nanotubes, the amount of graphite included in the layer can be reduced while still achieving similar ohmic resistance as regular graphite (e.g., about 5% by weight up to about 50% by weight based on the solids weight amount of the conductive paste). Thus, the resulting conductive coating 23 can provide sufficient conductivity to the device 10.

The binder in the conductive paste generally provides a base material to secure the conductive material within the resulting device 10 and can act to improve the mechanical properties and potentially the adhesion between the metal contact layer 24 and the p-type absorber layer 20. The binder is generally an organic material that is a polymeric binder in the resulting conductive coating 23 in the finished device 10. The polymeric binder can generally include at least one organic polymer (i.e., containing a carbon backbone) or a combination of polymers forming a polymer system. As used herein, the term "polymer" generally includes, but is not limited to, homopolymers; copolymers, such as, for example, block, graft, random and alternating copolymers; and terpolymers; and blends and modifications thereof. Furthermore, unless otherwise specifically limited, the term "polymer" shall include all possible geometrical configurations of the material. These configurations include, but are not limited to isotactic, syndiotactic, and random symmetries.

As such, the binder in the conductive paste can be a polymeric binder, a monomer system that polymerizes into a polymeric binder upon annealing, or a combination thereof. Particularly suitable polymer binders for inclusion within the resulting conductive coating 23 include but are not limited to a polyester, a polyvinyl alcohol (e.g., poly(vinylbutyral-co-vinylalcohol-co-vinylacetate)), a polyurethane, a (meth)acrylate polymer, an epoxide polymer, a polystyrene, a thioester polymeric binder, a thioether polymeric binder, vinylic binders (e.g., vinyl siloxanes, poly(meth)acrylates, tiol-ene reaction polymers), or copolymers or mixtures thereof.

Particularly suitable monomers for optional inclusion within the conductive paste, and polymerization during annealing to form the resulting conductive coating 23, include but are not limited to vinyl acetate monomers, urethane monomers, (meth)acrylate monomers, epoxide monomers, or combinations thereof. For example, the conductive paste can include a combination of a first monomer containing one or more isocyanate functional groups (preferably two or more functional groups) and a second monomer containing one or more hydroxyl groups (preferably two or more functional groups) to form a polyurethane upon polymerization with the alcohol and the isocyanate groups combining to form a urethane linkage. In embodiments where the binder includes a monomer system, a polymerization initiator can also be included in the paste to facilitate polymerization during curing.

In one particular embodiment, at least one of the monomers of the binder can be acidic to serve as an acid in the paste, but polymerizes into a polymeric binder during curing. Thus, in this embodiment, the acidic monomer can act as an acid in the conductive paste, but becomes inactive (through polymerization) in the resulting conductive coating 23 in the final device 10 due to no significant amount of the acidic monomer remaining after curing. One exemplary acidic monomer includes, but is not limited to, bis[2-(methacryloyloxy)ethyl] phosphate.

Nonpolar polymeric binders can be particularly suitable for inclusion in the conductive coating 23, since higher polarity binder materials tend to make the application of the conductive paste onto the surface 21 more difficult. Furthermore, a polymeric binder having aromatic groups (e.g., polystyrene, poly(vinyl naphthylene), poly (vinyl anthracene), etc. ...) can provide additional conductive properties due to the similar structure to that of graphite.

In one particular embodiment, the polymer system can be selected by its ability to facilitate Te enrichment of the surface 21 of the cadmium telluride layer 20 upon thermal, UV, ultrasonic, or microwave processing via by-products of processing, either independently or with the aid of the solvent system. The complete polymer and solvent system also embody an additional attribute that all reactants are completely exhausted during curing.

Additionally or alternatively, the polymer system can be selected by its ability to facilitate Cu doping of the surface 21 of the cadmium telluride layer 20 upon thermal, UV, ultrasonic, or microwave processing via by-products of processing, either independently or with the aid of the solvent system. The complete polymer and solvent system also embody an additional attribute that all reactants are completely exhausted during curing.

The total amount of the binder material is present, in one embodiment, at about 5% to about 25% by weight of the weight amount of the conductive material (e.g., graphite), when dried. If the binder material contains aromatic rings, the binder content can be increased to 40% without losing the conductive efficiency of the paste.

In one embodiment, the conductive paste can be applied as a dry powder to the surface 21. In another embodiment, the conductive paste is a liquid, but contains no solvent. Such an embodiment is particularly suitable when the conductive paste includes a liquid acid and/or a liquid monomer precursor for the binder.

In alternative embodiments, a solvent system can be utilized in the conductive paste, and can include at least one solvent that is configured to help apply the binder and/or the conductive material onto the surface 21 of the p-type absorber layer 20 during processing. As such, the particular solvent(s) can be selected based on the particular composition of the binder and/or the conductive material utilized in the conductive paste. The solvent can be substantially removed after applying the conductive paste to the surface 21 during subsequent processing (e.g., during curing) such that the resulting device 10 is substantially free from the solvent. Suitable solvents can include, but are not limited to dimethyl succinate, dimethyl glutarate, dimethyladipate, thiodiethanol, mixtures of various esters such as dibasic esters, dimethylformamide (DMF), dimethylsulfoxide, xylene, diglyme or triglyme, or mixtures thereof. In one particular embodiment, the solvent system includes at least one acid or acid generator, such as acetic acid, 1,2-dichloroethane, sulfuric acid, phosphonates, sulphonates, etc., or mixtures thereof.

The conductive paste can be applied onto the surface 21 of the p-type absorber layer during processing of the device 10 by any suitable method for spreading the blend or paste, such as screen printing, spraying, roll coating, or by a "doctor" blade. After the application of the conductive paste to the p-type absorber layer 20, the conductive paste can be cured to convert the conductive paste into the conductive coating 23. Such a curing process can evaporate the solvent system (if present) in the as-applied conductive paste and/or crosslink the polymeric binder to secure and/or bond the conductive coating 23 on the surface 21.

During curing, an acid from the conductive coating reacts to enrich the surface with tellurium, while being substantially consumed during curing such that the resulting conductive coating 23 in the device 10 is substantially free from an acid at the interface between the conductive coating 23 and the Te-enchiched region. As used herein, the term "substantially free" means no more than an insignificant trace amount present and encompasses completely free (e.g., less than about 0.1 wt %, more preferably less than 0.01 wt %, most preferably less than 0.001 wt %) at the interface between the surface 21 and conductive coating 23.

Also during curing, a copper source from the conductive coating reacts to form a copper doped tellurium/tellurium rich layer with or without copper telluride formation where copper telluride is present as $CuTe$, $Cu_{1.4}Te$, and/or $Cu_2Te$. The copper source is substantially consumed (e.g., reacted, evaporated, rendered inert, etc.) during curing such that the resulting conductive coating 23 in the device 10 is substantially free from an acid at the interface between the conductive coating 23 and the tellurium enriched/copper doped tellurium/copper tellurium region. As used herein, the term "substantially free" means no more than an insignificant trace amount present and encompasses completely free (e.g., less than about 0.1 wt %, more preferably less than 0.01 wt %, most preferably less than 0.001 wt) at the interface between the surface 21 and conductive coating 23.

As stated, at least one of the conductive material, the solvent system, or the polymeric binder can include the acid or an acid generator, or the acid or an acid generator can be included as a separate component of the conductive paste. For example, the acid may be part of the polymer system, or may be a monomer that is converted to a polymer during curing, or the acid or acid generator may be part of the solvent system.

Regardless of which component contains the acid or acid generator, the acid or acid generator can generally react with the surface 21 in such a manner as to enrich the surface with Te during the application of an energy source in curing (e.g., heat, light, sonication, microwave, etc. ...). Additionally, the acid or acid generator can create the Te-enriched region 22 in the p-type absorber layer 20 only when the energy source is applied. Thus, the degree of Te enrichment of the surface 21 can be controlled by the amount of energy applied. Alternatively or additionally, the degree of Te enrichment of the surface 21 can be controlled by limiting the amount of acid initially present within the conductive paste or generated by applying the energy source to the conductive paste.

As stated, at least one of the conductive material, the solvent system, or the polymeric binder can include the copper source, or the copper source can be included as a separate component of the conductive paste. For example, the copper source may be part of the polymer system, or may be a monomer that is converted to a polymer during curing, or the polymer source may be part of the solvent system.

Regardless of which component contains the copper source, the copper source can generally react with the surface 21 in such a manner as to dope the surface with Cu during the application of an energy source in curing (e.g., heat, light, sonication, microwave, etc. ...). Additionally, the copper source can create the Cu doped region 22 in the p-type absorber layer 20 only when the energy source is applied. Thus, the degree of Te enrichment and Cu doping of the surface 21 can be controlled by the amount of energy applied. Alternatively or additionally, the degree of Cu doping of the surface 21 can be controlled by limiting the amount of the copper source initially present within the conductive paste or generated by applying the energy source to the conductive paste.

When an acid is used within the conductive paste, the acid can, in particular embodiments, include at least one of a carboxylic acid, a phosphoric acid, a phoshonic acid (e.g., phenyl phosphonic acid), a phosphate acid, a sulfate acid, a sulfuric acid, a sulfonic acid, a protic acid (e.g., HCl, HBr, etc.), acetic acid, or malonic acid. Additionally, a mixture or combination of acids may be used.

Alternatively or additionally, an acid generator can be included in the conductive paste. An acid generator is generally defined as any substance that will create a protic acid when an energy source is provided. For example, N-chlorosuccinimide, sebacoyl chloride, methyl methanesulfonate, just to name a few, will generate an acid (e.g., HCl from N-chlorosuccinimide) when heated, excited with electromagnetic radiation, sonicated, or microwaved. Other energy sources may also work and can be used. When heat is used to generate the acid, the acid generation preferably starts above 50° C., more preferably above 90° C., and even more preferably, above 120° C. When electromagnetic radiation is used, various parts of the electromagnetic spectrum may be more useful than others. For instance, visible, ultraviolet, infrared, and microwave wavelengths are all useful wavelength ranges. When sonication is used, some testing may need to be performed to determine the set of frequencies that may function best. In some embodiments, both an acid or acids and an acid generator or generators can be used together.

Other samples of useful acid generators include, but are not limited to, $ZnCl_2$, $ZnBr_2$, CuCl, $CuCl_2$, CuBr, $CuBr_2$, $TiCl_4$, $SiCl_4$, an iodine-based salt, or organic derivatives thereof, or mixtures thereof. For instance, the sulfate, sulfonate, and sulfinate salts, as well as the phosphate, phosphonate, phosphinate salts, of these materials can also be used. Various fluoride and bromide derivatives can also be used.

A copper source contained in the conductive paste or as a separate compound to the conductive paste can be selected from any compound containing copper that will directly or indirectly form copper telluride as CuTe, $Cu_{1.4}Te$, $Cu_2Te$, and/or copper doped tellurium/tellurium enriched CdTe upon application of the paste to the CdTe. This doping reaction can start immediately upon contact or be initiated with an energy source such as heat, electromagnetic radiation, sonication, microwave or other energy sources). When heat is used to generate the copper for the Cu doping, the copper generation preferably starts above 50° C. When electromagnetic radiation is used, various parts of the electromagnetic spectrum may be more useful than others. For instance, visible, ultraviolet, infrared, and microwave wavelengths are all useful wavelength ranges. When sonication is used, some testing may need to be performed to determine the set of frequencies that may function best.

The copper source can be from copper metal, copper (I), and copper (II). Some example copper sources include but are not limited to: copper, copper oxides (e.g., CuO), copper salts, organo-copper compounds, and copper alloys. Preferably, copper salts and copper alloys are used. Some example copper salts are as follows (but are not limited to): $CuBr_2$, $CuBr_2$, CuCl, $CuCl_2$, CuI, $[C_6H_{11}(CH_2)_3CO_2]_2Cu$, $CuF_2$, $Cu(OH)_2$, $Cu_2(OH)PO_4$, $CuMoO_4$, $Cu(NO_3)_2$, $Cu(ClO_4)_2$, $Cu_2P_2O_7$, $CuSeO_3$, $CuSO_4$, $[CH3CO_2]_2Cu$, $Cu(BF_4)_2$, CuSCN, $Cu(NH_3)_4SO_4$, $CuCO_3$, CuTe, or mixtures thereof.

The copper source can be, in one particular embodiment, in the form of particles (including nanoparticles), wires (including nanowires), flakes (including nanoflakes), or mixtures thereof. For example, if copper metal is used, then nanoparticles and nanofibers of copper are particularly suitable. The pure metal can react with $TeH_2$ (which is created from acid reacting with CdTe) to form CuTe. Fortunately, the copper oxides on the metal's surface are substantially removed by acids and form the corresponding salt (e.g., CuO+ $2HCl \rightarrow CuCl_2+H_2O$); such salts can interact with the CdTe surface and create $CdCl_2$ and copper telluride as CuTe, $Cu_{1.4}Te$, $Cu_2Te$, and/or copper doped tellurium. Alternatively, pure copper oxides can be used and will react with the acids as described above. Many of the copper salts can be directly incorporated into a polymer, as such the polymer can be part of the binder in the conductive paste. Copper salts of polymers with carboxylic acids, sulfur based acids, and phosphorous based acids are particularly useful. Most preferably, the copper halides, copper oxides, copper metal, and tellurium copper alloys are used.

The concentration of copper in the conductive paste can be varied, for example, depending on the particular source of copper, the amount of copper doping desired, etc. In one particular embodiment, copper can be included in the conductive paste in an amount of about 0.01% by weight to about 1% by weight, such as about 0.01% by weight to about 0.5% by weight. For example, when included as a separate component in the conductive paste, the copper source can be included in the conductive paste in an amount of about 0.01% by weight to about 1% by weight, such as about 0.01% by weight to about 0.5% by weight.

In one embodiment, the conductive paste can be heated to cure the polymeric binder at a curing temperature of about 100° C. to about 250° C., such as about 130° C. to about 200° C. The curing duration at the curing temperature is, in certain embodiments, about 1 minute to about 30 minutes, such as about 1 minute to about 10 minutes.

Alternatively, the conductive paste can be cured to form a conductive coating by applying an ultraviolet light (e.g., having a wavelength of about 100 nm to about 400 nm) and/or visible light (e.g., having a wavelength of about 400 nm to about 800 nm) onto the conductive paste, applying microwave energy onto the conductive paste (e.g., having a wavelength of about 30 cm to about 1 mm and/or a frequency of about 1 to about 100 GHz), or ultrasonic curing the conductive paste at frequencies above 20 kHz. Such curing can be, in particular embodiments, performed at a curing duration of about 30 seconds to about 10 minutes.

The conductive coating 23 can further include other materials, such as an inert filler material (e.g., silicone, clay, etc.), as well as other processing aids or conductive fillers (e.g., carbon nanofibers, metal nanofibers, metal particles, and/or organic conductors).

The conductive coating 23 can have, for instance, a thickness (in the z-direction defined from the surface 21 of the p-type absorber layer 20 to the metal contact layer 24) of about 0.1 micrometers (μm) to about 20 μm, such as about 3 μm to about 15 μm (e.g., about 3 μm to about 8 μm).

Figure 2:
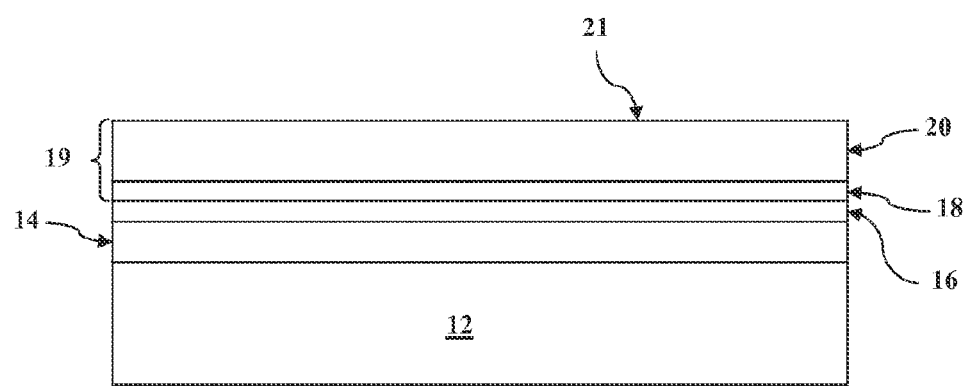
Figure 3:
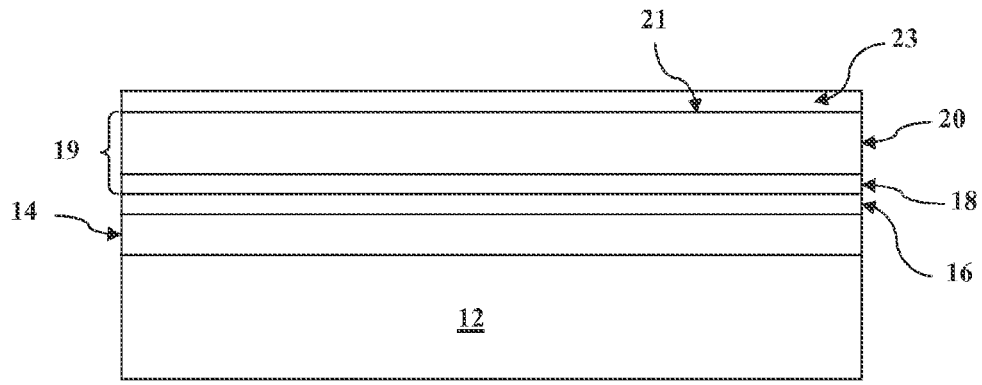
Figure 4:
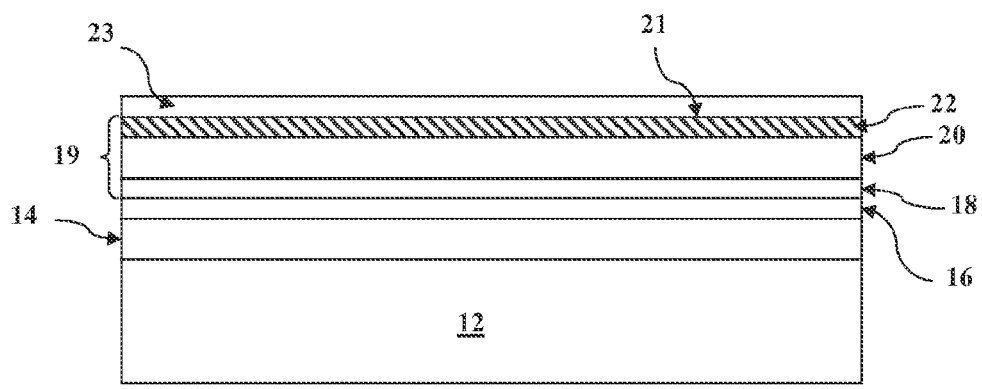

Generally, the conductive coating 23 can be used in any cadmium telluride thin film photovoltaic device 10, such as the exemplary device 10 shown in FIGS. 1-2. The exemplary device 10 of FIGS. 1-2 includes a transparent substrate 12 of glass. In this embodiment, the glass 12 can be referred to as a "superstrate," since it is the substrate on which the subsequent layers are formed, but it faces upwards to the radiation source (e.g., the sun) when the cadmium telluride thin film photovoltaic device 10 is in use. The top sheet of glass 12 can be a high-transmission glass (e.g., high transmission borosilicate glass), low-iron float glass, or other highly transparent glass material. The glass is generally thick enough to provide support for the subsequent film layers (e.g., from about 0.5 mm to about 10 mm thick), and is substantially flat to provide a good surface for forming the subsequent film layers. In one embodiment, the glass 12 can be a low iron float glass containing less than about 0.15% by weight iron (Fe), and may have a transmission of about 90% or greater in the spectrum of interest (e.g., wavelengths from about 300 nm to about 900 nm).

The transparent conductive oxide (TCO) layer 14 is shown on the transparent substrate 12 of the exemplary device 10. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate. Alternatively, the TCO layer can comprise carbon nanotubes or graphene and still be transparent.

The TCO layer 14 can be formed by sputtering, chemical vapor deposition, spray pyrolysis, or any other suitable deposition method. In one particular embodiment, the TCO layer 14 can be formed by sputtering, either DC sputtering or RF sputtering, on the glass 12. For example, a cadmium stannate layer can be formed by sputtering a hot-pressed target containing stoichiometric amounts of $SnO_2$ and CdO onto the glass 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 μm and about 1 μm, for example from about 0.1 μm to about 0.5 μm, such as from about 0.25 μm to about 0.45 μm. Suitable flat glass substrates having a TCO layer 14 formed on the superstrate surface can be purchased commercially from various glass manufactures and suppliers. For example, a particularly suitable glass 12 including a TCO layer 14 includes a glass commercially available under the name TEC 15 TCO from Pilkington North America Inc. (Toledo, Ohio), which includes a TCO layer having a sheet resistance of 15 ohms per square.

The resistive transparent buffer layer 16 (RTB layer) is shown on the TCO layer 14 on the exemplary cadmium telluride thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the cadmium sulfide layer 18 can allow for a relatively thin cadmium sulfide layer 18 to be included in the device 10 by reducing the possibility of interface defects (i.e., "pinholes" in the cadmium sulfide layer 18) creating shunts between the TCO layer 14 and the cadmium telluride layer 20. Thus, it is believed that the RTB layer 16 allows for improved adhesion and/or interaction between the TCO layer 14 and the cadmium telluride layer 20, thereby allowing a relatively thin cadmium sulfide layer 18 to be formed thereon without significant adverse effects that would otherwise result from such a relatively thin cadmium sulfide layer 18 formed directly on the TCO layer 14.

The RTB layer 16 can include, for instance, a combination of zinc oxide (ZnO) and tin oxide ($SnO_2$), which can be referred as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about a one to two (1:2) stoichiometric ratio of tin oxide to zinc oxide. The RTB layer 16 can be formed by sputtering, chemical vapor deposition, spray pyrolysis, or any other suitable deposition method. In one particular embodiment, the RTB layer 16 can be formed by sputtering, either DC sputtering or RF sputtering, on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 μm and about 1 μm, for example from about 0.1 μm to about 0.5 μm. In particular embodiments, the RTB layer 16 can have a thickness between about 0.08 μm and about 0.2 μm, for example from about 0.1 μm to about 0.15 μm.

The cadmium sulfide layer 18 is shown on resistive transparent buffer layer 16 of the exemplary device 10. The cadmium sulfide layer 18 is a n-type layer that generally includes cadmium sulfide (CdS) but may also include other materials, such as zinc sulfide, cadmium zinc sulfide, etc., and mixtures thereof as well as dopants and other impurities. In one particular embodiment, the cadmium sulfide layer may include oxygen up to about 25% by atomic percentage, for example from about 5% to about 20% by atomic percentage. The cadmium sulfide layer 18 can have a wide band gap (e.g., from about 2.25 eV to about 2.5 eV, such as about 2.4 eV) in order to allow most radiation energy (e.g., solar radiation) to pass. As such, the cadmium sulfide layer 18 is considered a transparent layer on the device 10.

The cadmium sulfide layer 18 can be formed by sputtering, chemical vapor deposition, chemical bath deposition, and other suitable deposition methods. In one particular embodiment, the cadmium sulfide layer 18 can be formed by sputtering, either direct current (DC) sputtering or radio frequency (RF) sputtering, on the resistive transparent layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent layer 16, the cadmium sulfide layer 18 can have a thickness that is less than about 0.1 µm, such as between about 10 nm and about 100 nm, such as from about 40 nm to about 80 nm, with a minimal presence of pinholes between the resistive transparent layer 16 and the cadmium sulfide layer 18. Additionally, a cadmium sulfide layer 18 having a thickness less than about 0.1 µm reduces any absorption of radiation energy by the cadmium sulfide layer 18, effectively increasing the amount of radiation energy reaching the underlying cadmium telluride layer 20.

The cadmium telluride layer 20 is shown on the cadmium sulfide layer 18 in the exemplary cadmium telluride thin film photovoltaic device 10 of FIG. 1. The cadmium telluride layer 20 is a p-type absorber layer that generally includes cadmium telluride (CdTe) but may also include other materials. As the p-type absorber layer of device 10, the cadmium telluride layer 20 is the photovoltaic layer that interacts with the cadmium sulfide layer 18 (i.e., the n-type layer) to produce current from the adsorption of radiation energy by absorbing the majority of the radiation energy passing into the device 10 due to its high absorption coefficient and creating electron-hole pairs. For example, the cadmium telluride layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the p-type side (i.e., the cadmium telluride layer 20) across the junction to the n-type side (i.e., the cadmium sulfide layer 18) and, conversely, holes may pass from the n-type side to the p-type side. Thus, the p-n junction formed between the cadmium sulfide layer 18 and the cadmium telluride layer 20 forms a diode in which the charge imbalance leads to the creation of an electric field spanning the p-n junction. Conventional current is allowed to flow in only one direction and separates the light induced electron-hole pairs.

The cadmium telluride layer 20 can be formed by any known process, such as vapor transport deposition, chemical vapor deposition (CVD), spray pyrolysis, electro-deposition, sputtering, close-space sublimation (CSS), etc. In one particular embodiment, the cadmium sulfide layer 18 is deposited by a sputtering and the cadmium telluride layer 20 is deposited by close-space sublimation. In particular embodiments, the cadmium telluride layer 20 can have a thickness between about 0.1 µm and about 10 µm, such as from about 1 µm and about 5 µm. In one particular embodiment, the cadmium telluride layer 20 can have a thickness between about 2 µm and about 4 µm, such as about 3 µm.

A series of post-forming treatments can be applied to the exposed surface of the cadmium telluride layer 20. These treatments can tailor the functionality of the cadmium telluride layer 20 and prepare its surface for subsequent adhesion to the back contact layers, particularly the conductive coating 23. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type absorber layer of cadmium telluride. Without wishing to be bound by theory, it is believed that annealing the cadmium telluride layer 20 (and the device 10) converts the weakly p-type cadmium telluride layer 20 to a more strongly p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as $CdO$, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type absorber layer) and the back contact layer(s). Specifically, the addition of copper can create a surface layer of cuprous telluride ($Cu_2Te$). Thus, the Te-rich surface of the cadmium telluride layer 20 can enhance the collection of current created by the device through lower resistivity between the cadmium telluride layer 20 and the back contact layer 23, 24. The copper doping/Te enriching process, as outlined above, or can be combined into a single step as described in this invention.

However, in certain embodiments, the Te-enriching step and/or the copper doping step can be omitted due to the presence of the acid and copper source during curing of the conductive coating 23. In one embodiment, the copper doping and/or etching can be performed by including a copper source (e.g., copper chloride) within the paste, in addition to the acid, such that etching and copper doping of the cadmium telluride layer 20 occurs during curing.

The back contact is formed from the conductive coating 23 and the metal contact layer 24 shown on the cadmium telluride layer 20 and generally serves as the back electrical contact, in relation to the opposite, TCO layer 14 serving as the front electrical contact. The back contact is formed on, and in one embodiment is in direct contact with, the cadmium telluride layer 20.

The metal contact layer 24 is suitably made from one or more highly conductive materials, such as elemental nickel, chromium, copper, tin, aluminum, gold, silver, technetium or alloys or mixtures thereof. The metal contact layer 24, if made of or comprising one or more metals, is suitably applied by a technique such as sputtering or metal evaporation. The metal contact layer 24 can be from about 0.1 µm to about 1.5 µm in thickness.

In one embodiment, another interlayer metal (e.g., titanium, gold, molybdenum, or combinations thereof) can be present in the conductive paste as a replacement for, or in addition to, the copper source. For example, in one embodiment, titanium metal, Ti(II), Ti(III), and/or Ti(IV) can be used as a replacement to copper or in addition to copper in the conductive paste. In another exemplary embodiment, gold may also be used as a replacement to copper or in addition to copper in the conductive paste. In yet another exemplary embodiment, molybdenum metal and/or its salts may also be used as a replacement to copper or in addition to copper in the conductive paste. In still another embodiment, Te is added as a source metal instead of, or in addition to, being formed by the acid. As such, in one particular embodiment, an interlayer metal source can be included in the conductive paste in addition to a copper source or without any copper present in the conductive paste.

Other components (not shown) can be included in the exemplary device 10, such as buss bars, external wiring, laser etches, etc. For example, when the device 10 forms a photovoltaic cell of a photovoltaic module, a plurality of photovoltaic cells can be connected in series in order to achieve a desired voltage, such as through an electrical wiring connection. Each end of the series connected cells can be attached to a suitable conductor such as a wire or bus bar, to direct the photovoltaically generated current to convenient locations for connection to a device or other system using the generated electricity. A convenient means for achieving such series connections is to laser scribe the device to divide the device into a series of cells connected by interconnects. In one particular embodiment, for instance, a laser can be used to ablate the deposited layers of the semiconductor device to divide the device into a plurality of series connected cells, as described above with respect to FIG. 1.

Photovoltaic devices formed according to any of the above described methods are also generally provided.

EXAMPLE

An example formulation incorporating both Te enrichment and copper doping is as follows:

| Component | Weight % | Solids weight % |
|---|---|---|
| DBE | 42.2 | — |
| poly(vinylbutyral-co-vinylalcohol-co-vinylacetate) | 4.2 | 7.3 |
| art graphite | 42.2 | 73.0 |
| di(trimethylolpropane)tetraacrylate | 5.6 | 9.6 |
| bis[2-(methacryloyloxy)-ethyl]phosphate | 5.0 | 8.6 |
| Copper source | 0.1 | 0.15 |
| 2,2'-Azoisobutyronitrile | 0.8 | 1.3 |

Different copper sources produce different amounts of copper on the surface which is greatly dependent on the concentration of and type of acid used, the cure temperature and duration, and the size, type, and concentration of copper source used.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of forming a back contact on a thin film photovoltaic device, the method comprising:
applying a conductive paste onto a surface defined by a p-type absorber layer of a p-n junction, wherein the p-type absorber layer comprises cadmium telluride, and wherein the conductive paste comprises a conductive material, a solvent system, a binder, and a copper source present as a nanoparticle, wire, flake, or a mixture thereof; and,
curing the conductive paste to form a conductive coating on the surface defined by a p-type absorber layer of the p-n junction, wherein during curing an acid from the conductive paste reacts to enrich the surface with tellurium, and wherein the acid is substantially consumed during curing;
wherein during curing copper is deposited onto the Te enriched surface.

2. The method of claim 1, wherein the copper source comprises $CuBr$, $CuBr_2$, $CuCl$, $CuCl_2$, $CuI$, $[C_6H_{11}(CH_2)_3 CO_2]_2Cu$, $CuF_2$, $Cu(OH)_2$, $Cu_2(OH)PO_4$, $CuMoO_4$, $Cu(NO_3)_2$, $Cu(ClO_4)_2$, $Cu_2P_2O_7$, $CuSeO_3$, $CuSO_4$, $[CH_3CO_2]_2Cu$, $Cu(BF_4)_2$, $CuSCN$, $Cu(NH_3)_4SO_4$, $CuCO_3$, $CuTe$, $Cu_{1.4}Te$ or $Cu_2Te$, or mixtures thereof.

3. A method of forming a back contact on a thin film photovoltaic device, the method comprising:
applying a conductive paste onto a surface defined by a p-type absorber layer of a p-n junction, wherein the p-type absorber layer comprises cadmium telluride, and wherein the conductive paste comprises a conductive material, a copper source, a solvent system, and a binder; and,
curing the conductive paste to form a conductive coating on the surface defined by a p-type absorber layer of the p-n junction, wherein during curing an acid from the conductive paste reacts to enrich the surface with tellurium, and wherein the acid is substantially consumed during curing;
wherein during curing copper is deposited onto the Te enriched surface, and wherein the copper source comprises pure copper metal.

4. A method of forming a back contact on a thin film photovoltaic device, the method comprising:
applying a conductive paste onto a surface defined by a p-type absorber layer of a p-n junction, wherein the p-type absorber layer comprises cadmium telluride, and wherein the conductive paste comprises a conductive material, a copper source, a solvent system, and a binder; and,
curing the conductive paste to form a conductive coating on the surface defined by a p-type absorber layer of the p-n junction, wherein during curing an acid from the conductive paste reacts to enrich the surface with tellurium, and wherein the acid is substantially consumed during curing;
wherein during curing copper is deposited onto the Te enriched surface, and wherein the copper source comprises a pure copper oxide.

5. A method of forming a back contact on a thin film photovoltaic device, the method comprising:
applying a conductive paste onto a surface defined by a p-type absorber layer of a p-n junction, wherein the p-type absorber layer comprises cadmium telluride, and wherein the conductive paste comprises a conductive material, a solvent system, and a binder; and,
curing the conductive paste to form a conductive coating on the surface defined by a p-type absorber layer of the p-n junction, wherein during curing an acid from the conductive paste reacts to enrich the surface with tellurium, and wherein the acid is substantially consumed during curing;
wherein during curing copper is deposited onto the Te enriched surface, and wherein the binder in the conductive paste comprises a copper salt of a carboxylic acid, a sulfur based acid, a phosphorous based acid, or a combination thereof.

6. A method of forming a back contact on a thin film photovoltaic device, the method comprising:
applying a conductive paste onto a surface defined by a p-type absorber layer of a p-n junction, wherein the p-type absorber layer comprises cadmium telluride, and wherein the conductive paste comprises a conductive material, a solvent system, and a binder; and,
curing the conductive paste to form a conductive coating on the surface defined by a p-type absorber layer of the p-n junction, wherein during curing an acid from the conductive paste reacts to enrich the surface with tellurium, and wherein the acid is substantially consumed during curing;
wherein during curing copper is deposited onto the Te enriched surface, and wherein the conductive paste further comprises a tellurium source.

7. The method of claim 1, wherein the conductive material comprises tellurium.

8. The method of claim 1, wherein curing is achieved through the application of energy in the form of heat, electromagnetic radiation, sonication, or microwave energy.

9. A method of forming a back contact on a thin film photovoltaic device, the method comprising:
applying a conductive paste onto a surface defined by a p-type absorber layer of a p-n junction, wherein the p-type absorber layer comprises cadmium telluride, and wherein the conductive paste comprises a conductive material, a copper source, and a binder; and,
curing the conductive paste to form a conductive coating layer on the surface defined by a p-type absorber layer of the p-n junction, wherein during curing an acid from the conductive paste reacts to enrich the surface with tellurium, and wherein the acid is substantially consumed during curing;
wherein copper is reacted with the surface to form a copper tellurium compound comprising CuTe, $Cu_{1.4}Te$, $Cu_2Te$, or a combination thereof.

10. The method of claim 9, wherein the copper source is present in the conductive paste as a nanoparticle, wire, flake, or a mixture thereof.

11. A method of forming a back contact on a thin film photovoltaic device, the method comprising:
applying a conductive paste onto a surface defined by a p-type absorber layer of a p-n junction, wherein the p-type absorber layer comprises cadmium telluride, and wherein the conductive paste comprises a conductive material, a copper source comprising pure copper metal, and a binder; and,
curing the conductive paste to form a conductive coating layer on the surface defined by a p-type absorber layer of the p-n junction, wherein during curing an acid from the conductive paste reacts to enrich the surface with tellurium, and wherein the acid is substantially consumed during curing;
wherein copper is reacted with the surface to form a copper tellurium compound.

12. A method of forming a back contact on a thin film photovoltaic device, the method comprising:
applying a conductive paste onto a surface defined by a p-type absorber layer of a p-n junction, wherein the p-type absorber layer comprises cadmium telluride, and wherein the conductive paste comprises a conductive material, a copper source comprising a pure copper oxide, and a binder; and,
curing the conductive paste to form a conductive coating layer on the surface defined by a p-type absorber layer of the p-n junction, wherein during curing an acid from the conductive paste reacts to enrich the surface with tellurium, and wherein the acid is substantially consumed during curing;
wherein copper is reacted with the surface to form a copper tellurium compound.

13. The method of claim 9, wherein the copper source comprises CuBr, $CuBr_2$, CuCl, $CuCl_2$, CuI, $[C_6H_{11}(CH_2)_3CO_2]_2Cu$, $CuF_2$, $Cu(OH)_2$, $Cu_2(OH)PO_4$, $CuMoO_4$, $Cu(NO_3)_2$, $Cu(ClO_4)_2$, $Cu_2P_2O_7$, $CuSeO_3$, $CuSO_4$, $[CH_3CO_2]_2Cu$, $Cu(BF_4)_2$, CuSCN, $Cu(NH_3)_4SO_4$, $CuCO_3$, CuTe, or mixtures thereof.

14. A method of forming a back contact on a thin film photovoltaic device, the method comprising:
applying a conductive paste onto a surface defined by a p-type absorber layer of a p-n junction, wherein the p-type absorber layer comprises cadmium telluride, and wherein the conductive paste comprises a conductive material, a solvent system, an interlayer metal source, and a binder; and,
curing the conductive paste to form a conductive coating on the surface defined by a p-type absorber layer of the p-n junction, wherein during curing an acid from the conductive paste reacts to enrich the surface with tellurium, and wherein the acid is substantially consumed during curing;
wherein during curing a metal dopant from the interlayer metal source is deposited onto the Te enriched surface, the metal dopant comprising tellurium, titanium, gold, molybdenum, or combinations thereof, and
wherein the conductive paste is substantially free from copper.

15. A method of forming a back contact on a thin film photovoltaic device, the method comprising:
applying a conductive paste onto a surface defined by a p-type absorber layer of a p-n junction, wherein the p-type absorber layer comprises cadmium telluride, and wherein the conductive paste comprises a conductive material, a solvent system, an interlayer metal source, a copper source, and a binder; and,
curing the conductive paste to form a conductive coating on the surface defined by a p-type absorber layer of the p-n junction, wherein during curing an acid from the conductive paste reacts to enrich the surface with tellurium, and wherein the acid is substantially consumed during curing;
wherein during curing a metal dopant from the interlayer metal source is deposited onto the Te enriched surface, the metal dopant comprising copper, tellurium, titanium, gold, molybdenum, or combinations thereof.

* * * * *